(12) United States Patent
Khuri-Yakub et al.

(10) Patent No.: US 7,741,686 B2
(45) Date of Patent: Jun. 22, 2010

(54) TRENCH ISOLATED CAPACITIVE MICROMACHINED ULTRASONIC TRANSDUCER ARRAYS WITH A SUPPORTING FRAME

(75) Inventors: Butrus T. Khuri-Yakub, Palo Alto, CA (US); Xuefeng Zhuang, Stanford, CA (US); Arif Sanli Ergun, Mountain View, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 113 days.

(21) Appl. No.: 11/880,459

(22) Filed: Jul. 20, 2007

(65) Prior Publication Data
US 2008/0048211 A1 Feb. 28, 2008

Related U.S. Application Data

(60) Provisional application No. 60/832,317, filed on Jul. 20, 2006.

(51) Int. Cl.
*H01L 29/93* (2006.01)
(52) U.S. Cl. .............................. 257/416; 257/E29.324; 257/595; 438/53
(58) Field of Classification Search ................ 257/774, 257/E29.324, 416, 595; 367/181; 438/53
See application file for complete search history.

(56) References Cited

U.S. PATENT DOCUMENTS

| | | | | |
|---|---|---|---|---|
| 6,836,020 | B2 * | 12/2004 | Cheng et al. ................. | 257/774 |
| 2002/0030728 | A1 * | 3/2002 | Susukida et al. ............. | 347/202 |
| 2002/0154381 | A1 * | 10/2002 | Bishop et al. ................ | 359/291 |
| 2004/0236223 | A1 * | 11/2004 | Barnes et al. ................ | 600/459 |

* cited by examiner

*Primary Examiner*—Thanh V Pham
*Assistant Examiner*—Maria Ligai
(74) *Attorney, Agent, or Firm*—Lumen Patent Firm (57) ABSTRACT

A one or two-dimensional capacitive micro-machined ultrasonic transducer (CMUT) array with supporting frame is provided. The CMUT array has at least three array elements deposited on a conductive substrate. The invention also has at least one CMUT cell in the array element, a conductive top layer deposited to a top side of the element, and a conductive via disposed within the elements. The via is isolated from the conductive top layer and conducts with the substrate. There are at least two isolation trenches in the conductive substrate, and the trenches are disposed between adjacent vias to conductively isolating the vias. A substrate region between the trenches forms a mechanical support frame. At least one conductive electrode is deposited to a bottom surface of the conductive substrate, where the electrode conducts with the via. The support frame eliminates the need for a carrier wafer in the process steps.

5 Claims, 7 Drawing Sheets

TRENCH ISOLATED CAPACITIVE MICROMACHINED ULTRASONIC TRANSDUCER ARRAYS WITH A SUPPORTING FRAME

CROSS-REFERENCE TO RELATED APPLICATIONS

This application is cross-referenced to and claims the benefit from U.S. Provisional Patent Application 60/832,317 filed Jul. 20, 2006, which is hereby incorporated by reference.

STATEMENT REGARDING FEDERALLY SPONSORED RESEARCH OR DEVELOPMENT

The present invention was supported in part by grant number CA099059 from the NIH. The U.S. Government has certain rights in the invention.

FIELD OF THE INVENTION

The invention relates generally to ultrasonic transducers. More particularly, the invention relates to one-dimensional and two-dimensional trench isolated capacitive micro-machined ultrasonic transducer (CMUT) arrays built on a silicon-on-insulator (SOI) wafer having a supporting mesh frame using either wafer-bonding or sacrificial release methods.

BACKGROUND

In large, fully populated 1D and 2D transducer arrays, providing connection to each array element is a challenge. In the case of 2D CMUT arrays, researchers have reported on interconnect techniques both based on through-wafer vias and through wafer trench isolation. In the through-wafer via implementation, a conductive material, usually doped polysilicon, is used to fill the vias and serves as the conductor between the front and back sides of the array elements. It was found that after the deposition of the polysilicon, performing wafer-to-wafer fusion bonding is difficult. Therefore, the through-wafer via approach is limited to only surface micromachining CMUT processes.

It has further been reported that in the trench isolation process, a carrier wafer is required during the deep reactive ion etching (DRIE) and the flip-chip bonding steps to provide the mechanical support for the membranes. This particular requirement presents certain drawbacks in processing. Good adhesion between the carrier wafer and the membrane surface is required for adequate mechanical support for the membranes. However, it is difficult to separate the carrier wafer and the membrane after the flip-chip bonding. The adhesive material may also swell in the solvent, creating stress that can break the CMUT membranes. It is highly desirable to eliminate the need of the carrier wafer for the trench isolation process.

SUMMARY OF THE INVENTION

A trench-isolated CMUT array with a supporting mesh frame for fully populated 1D and 2D arrays is provided. According to the current invention, the CMUT array is built on a silicon-on-insulator (SOI) wafer. Electrical interconnections to array elements are provided through the highly conductive silicon substrate. Neighboring array elements are separated from one another by trenches on both the device layer and the bulk silicon. A mechanically supporting frame is designed as a mesh structure between the silicon pillars providing electrical connections to the individual elements. The framed trench isolation is compatible with both wafer-bonded and surface-micromachined CMUTs. The invention eliminates the need for attaching the device wafer to a carrier wafer for the required mechanical support during the deep trench etching and flip-chip bonding steps, which presents difficulties during the release of the carrier wafer.

According to one aspect of the invention, a one-dimensional or a two-dimensional capacitive micro-machined ultrasonic transducer (CMUT) array with supporting frame has at least three CMUT array elements deposited on a conductive substrate. The invention also has at least one CMUT cell in the array element, a conductive top layer deposited to a top side of the element, and a conductive via disposed within the elements. The via is isolated from the conductive top layer and conducts with the substrate. There are at least two isolation trenches in the conductive substrate, wherein the trenches are disposed between adjacent vias to conductively isolating the vias. A substrate region between the trenches forms a mechanical support frame, and at least one conductive electrode is deposited to a bottom surface of the conductive substrate, where the electrode is disposed to conduct with the via.

In another aspect of the invention, the conductive substrate has a silicon-on-insulator wafer, where the wafer includes a silicon oxide layer on a silicon layer.

In a further aspect of the invention, the conductive top layer is a conductive material such as aluminum, titanium, tungsten or polysilicon.

In one aspect of the invention, the conductive top layer can be omitted when the top side of the element is as highly conductive silicon membrane.

In a further aspect of the invention, the conductive via is a conductive material such as aluminum, polysilicon or amorphous silicon.

In yet another aspect, the conductive electrode can be copper, titanium, gold, platinum, aluminum or nickel.

The current invention includes a method of fabricating a one-dimensional or two-dimensional capacitive micro-machined ultrasonic transducer (CMUT) array with supporting frame. The method includes the steps of providing a double-side-polished silicon-on-insulator wafer, etching CMUT cavities in a device layer of the wafer using oxidation and buffered oxide etching methods, electrically dividing front electrical pads on the wafer using deep reactive ion etching, bonding a second silicon-on-insulator wafer to the etched device layer, removing a handle layer of the second silicon-on-insulator wafer, providing a contact via on each array element of the CMUT array using photo lithography and wet etching or dry etching, depositing a conductive top electrode material on the etched wafer, removing the conductive material around the vias to separate front and back electrodes from each other, etching through-wafer trenches on the silicon wafer for electrical isolation and to define a supporting frame, patterning signal electrodes on the back electrodes, and flip-chip bonding CMUT arrays to appropriate electronic circuits or printed circuit boards.

In one aspect of the method of fabricating a one-dimensional or two-dimensional capacitive micro-machined ultrasonic transducer (CMUT) array with supporting frame, the wafer bonding steps are replaced with sacrificial layer releasing steps.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Figure 1:
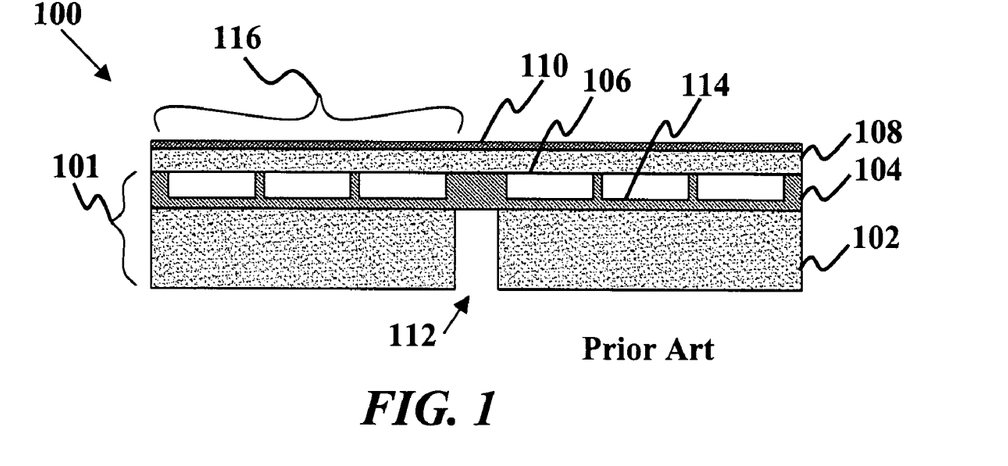
FIG. 1 shows a schematic cross-section planar view of a prior art trench isolated CMUT without supporting frame.

FIG. 1 shows a schematic cross-section planar view of a prior art trench isolated CMUT without supporting frame 100. Shown is a prime silicon wafer 101 having a silicon layer 102 of bulk silicon holding an oxide layer 104 having CMUT cell cavities 106 covered with a membrane/top metal layer 108 as a conductive front electrode, where the bulk silicon 102 is a back electrode. The conductive bulk silicon 102 has an isolation trench 112 for separating the array elements 116 for improved array performance.

Typically, a carrier wafer (not shown) is required during the deep reactive ion etching (DRIE) and the flip-chip bonding steps to provide the mechanical support for the membranes 106. This particular requirement presents certain drawbacks in processing. Good adhesion between the carrier wafer and the surface of the membrane 106 is required for adequate mechanical support for the membranes 106. However, it is difficult to separate the carrier wafer (not shown) and the membrane 106 after the flip-chip bonding. The adhesive material may also swell in the solvent, creating stress that can break the CMUT membranes 106. It is highly desired to eliminate the need of the carrier wafer for the trench isolation process. Further, in frameless trench-isolated CMUT arrays 100, only a few microns of silicon 108 and silicon dioxide (oxide layer 104) remain between array elements 116 after the DRIE process. These thin-films are fragile and present handling difficulties. The carrier wafer is therefore needed for additional mechanical support during DRIE and flip-chip bonding steps.

Figure 2:
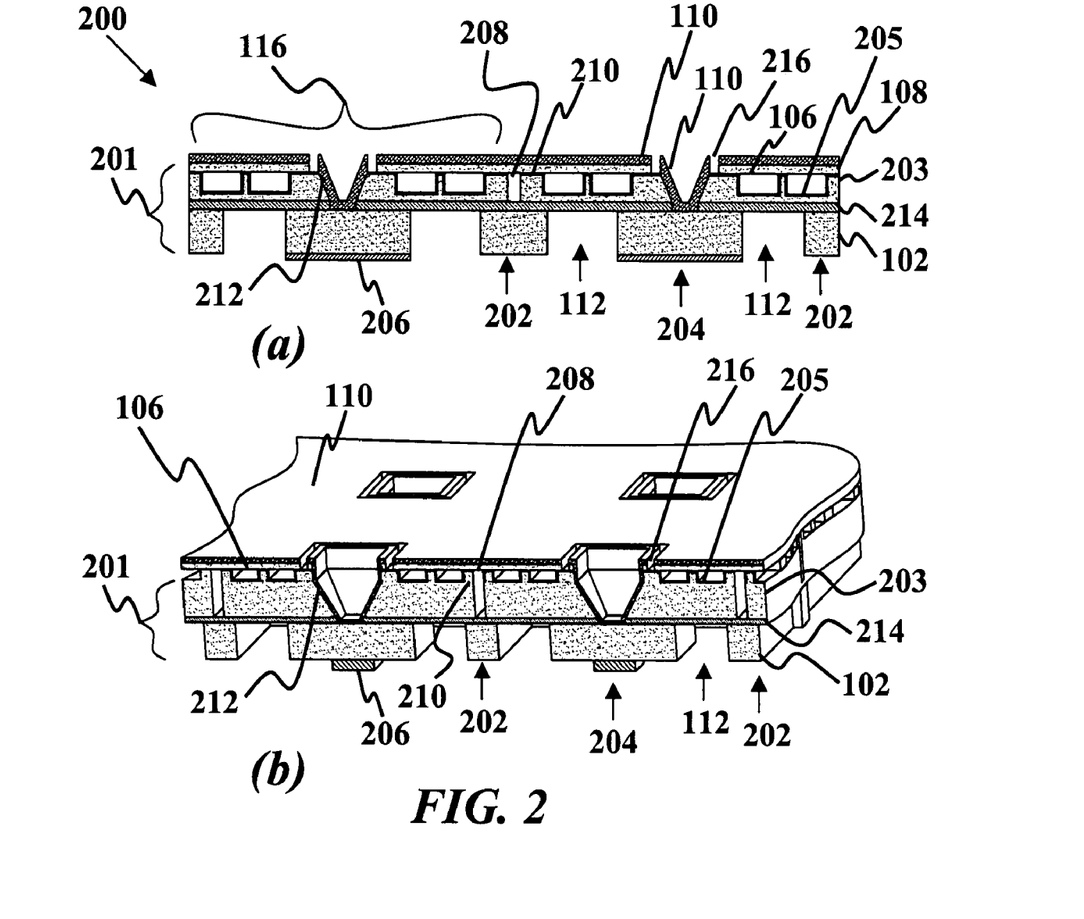
FIGS. 2a-2b show a schematic cross-section planar view and a perspective cutaway view of a trench isolated CMUT with supporting frame according to the present invention.

FIGS. 2a and 2b show a schematic cross-section planar view and a perspective cutaway view, respectively, of a trench isolated CMUT with supporting frame 200 according to the present invention. One-dimensional and two-dimensional capacitive micro-machined ultrasonic transducer (CMUT) arrays 200 are provided. The invention includes a CMUT array on a silicon-on-insulator (SOI) wafer 201 using either wafer-bonding or sacrificial release techniques. The SOI wafer 201 has a conductive substrate 102 holding a device layer 203. Preferably, the device layer 203 and the buried-oxide (BOX) 214 layer of the SOI wafer 201 are thick, and the conductivity of both the device layer 203 and handle (bulk) layer 102 of the SOI wafer 201 is high. The device layer 203 has an oxide insulation layer 205 disposed thereon to enable the cells 106 to operate in a collapsed-mode (not shown) without short-circuiting. The electrical interconnects to the CMUT array elements 116 are provided through the highly conductive silicon substrate 102. A deep through-wafer trench 112 provides isolation, and a frame structure 202 provides mechanical support for the rigidity of the CMUT array 200. Neighboring array elements 116 are separated from one another by device trenches 208 and bulk silicon trenches 112. On each element 116, the device layer 203 and the silicon bulk 102 are electrically connected by etching vias 212 through the oxide layer 214 and depositing conductive materials therein. The frame 202 is made of bulk silicon and is generally at a different electrical potential than the back electrode 110.

Parasitic parallel capacitance is reduced by using a thick BOX layer 214 in the SOI wafer 201, etching wider trenches 112 between the electrode 206 and the frame 202, reducing the frame width 202 and reducing the bulk layer 102 thickness. The series resistance of the interconnect can be reduced by using a highly conductive silicon substrate 102 and by thinning down the substrate 102.

Because the isolation trenches 112 are formed after the CMUT membranes 106 have been fabricated on the front side of the wafer 201, the through-wafer trench-isolation process is compatible with both the surface micromachining and wafer-to-wafer fusion bonding techniques.

Using a supporting frame 202 with the trench isolated CMUT arrays preserves the advantages of the frameless trench isolation process 100, such as the compatibility with both wafer-bonding and surface micromachining processes, and eliminates the need of a carrier wafer. It is therefore an important enabling technology for the advancement of 1D and 2D CMUT arrays.

Instead of the carrier wafer (not shown), the trench-isolated CMUT arrays with a supporting frame 200 have a built-in silicon mesh structure 202 disposed between the array elements 116 to provide the needed mechanical support. A cross-sectional view is shown in FIG. 2(a) and a 3D perspective diagram of the supporting frame is shown in FIG. 2(b). Both the supporting frame 202 and the signal electrodes 206 are built into the substrate 102 of a highly conductive SOI wafer 201. Deep through-wafer trenches 112 are etched from the back side of the SOI wafer 102 to separate the frame 202 and the signal electrodes 206. The front electrical pads 210 are electrically divided by device layer trenches 208 etched on the device layer 203 of the same SOI wafer 201. A via 212 is etched on the device layer silicon 203 and the buried oxide (BOX) layers 214 so that conductive material 110, such as aluminum, can be deposited into the via 212 to bring electrical continuity for the signal electrodes 206. Electrode separation trenches 216 are formed in the conductive material 110 deposited in the vias 212 to isolate the top electrode 110 from the signal electrodes 206. In the trench-isolated CMUT arrays with supporting frames 200, the parasitic capacitance is largely determined by the overlapping areas between the device layer 203 and bulk layer 102 of the SOI wafer 201. Therefore, the parasitic capacitance can be reduced by increasing the BOX layer 214 thickness and by reducing the width of the mesh frames 202. The inventors have determined that SOI sample pieces with frames 202 as narrow as 10 µm could be handled like regular pieces of silicon. The thickness of the BOX layer 214 can be easily made to 4-5 µm thick in a wet oxidation environment at 1100° C. for 48 hours.

Figure 3:
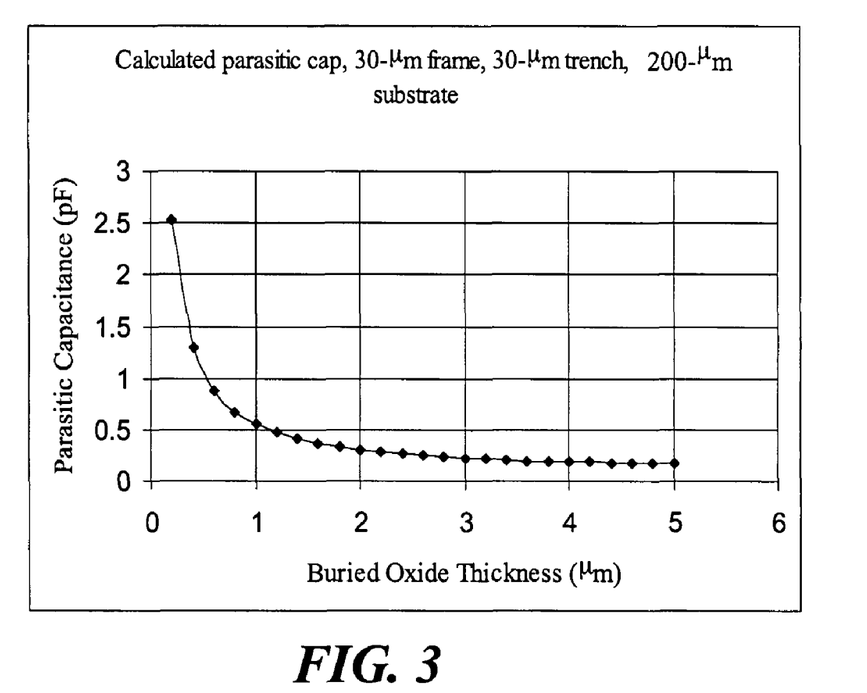
FIG. 3 shows the calculated parasitic capacitance as a function of BOX layer thickness for a 200-μm thick SOI wafer with a frame width of 30 μm and a trench width of 30 μm according to the present invention.

FIG. 3 shows a graph of the calculated parasitic capacitance as a function of BOX layer 214 thickness for a 200-µm thick SOI wafer 102 with a frame width of 30 µm. As shown in FIG. 3, the parasitic capacitance can be reduced to an insignificant level by design, assuming the device capacitance of an array element is in the order of 1 pF.

Figure 4:
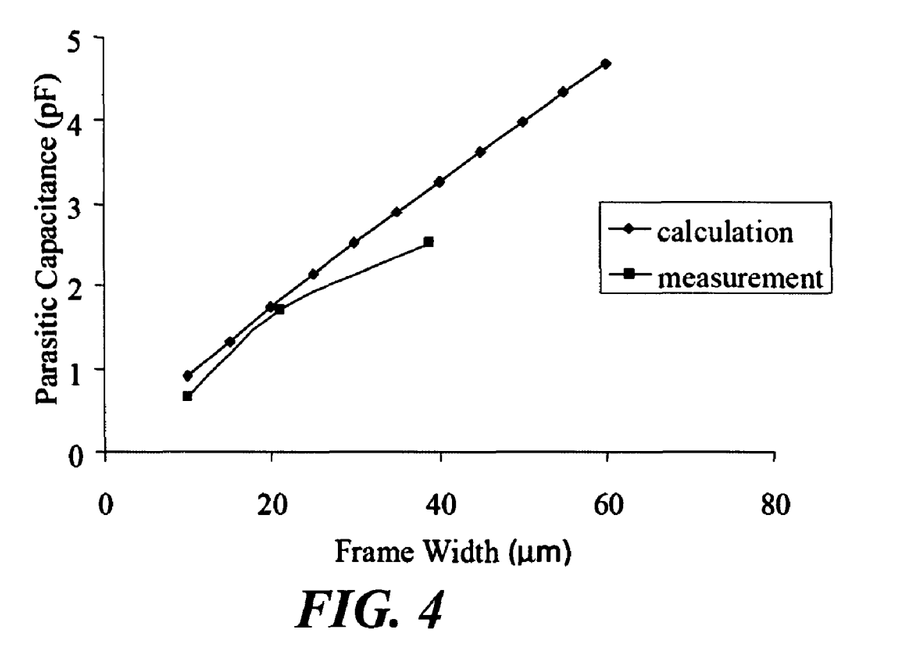
FIG. 4 shows the measured and calculated parasitic capacitance values due to the frame structure of a trench isolated CMUT with supporting frame according to one embodiment of the invention.
Figure 5:
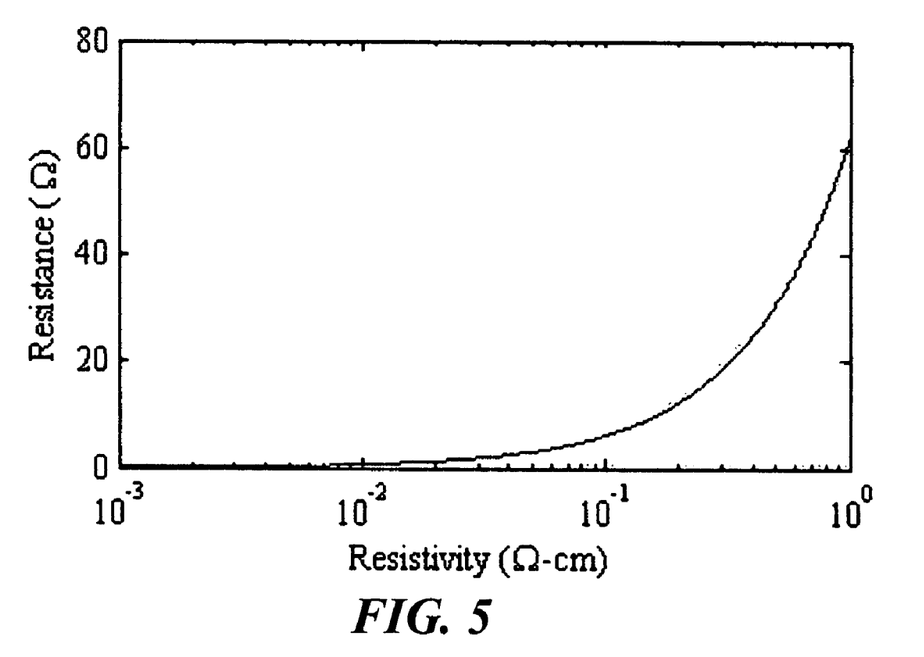
FIG. 5 shows the expected resistance values of an electrode for various substrate resistivities of a trench isolated CMUT with supporting frame according to one embodiment of the invention.

To confirm the calculation of the parasitic capacitance, test dummy devices consisting of mesh frames 202 and front side electrical pads 210 were fabricated on an SOI wafer 102 with an 8-µm device layer 203 and 0.2-µm BOX layer 212. FIG. 4 shows a graph of the measured and calculated capacitance values. One possible explanation for the smaller measured capacitance than the calculated capacitance is the footing phenomenon of the DRIE when the etching is terminated on oxide. Footing reduces the effective overlapping areas between the signal electrode 206 and ground electrodes 110 and thus results in lower parasitic capacitance. Series resistance is a function of the size of the signal electrode 206 and the resistivity of the silicon substrate 102. To reduce the series resistance, a highly conductive substrate is desired. FIG. 5 shows the expected resistance values of an electrode for various substrate resistivities. When a highly conductive substrate 102 is used, the series resistance can be ignored. Because a contact via 212 is needed in the device layer 214 to make electrical continuity for the interconnects, the fill factor of the CMUT is affected. This is analogous to the reduction of fill factor in CMUTs with through-wafer via interconnects. This impact of fill factor is compensated by the fact that the isolation trench 208 on the front side of the device layer 203 can be narrow (a few microns) because this layer 203 is relatively thin and definition of narrow trenches 208 is possible using DRIE. A fill factor of 0.72 has been achieved by the inventors.

Figure 6:
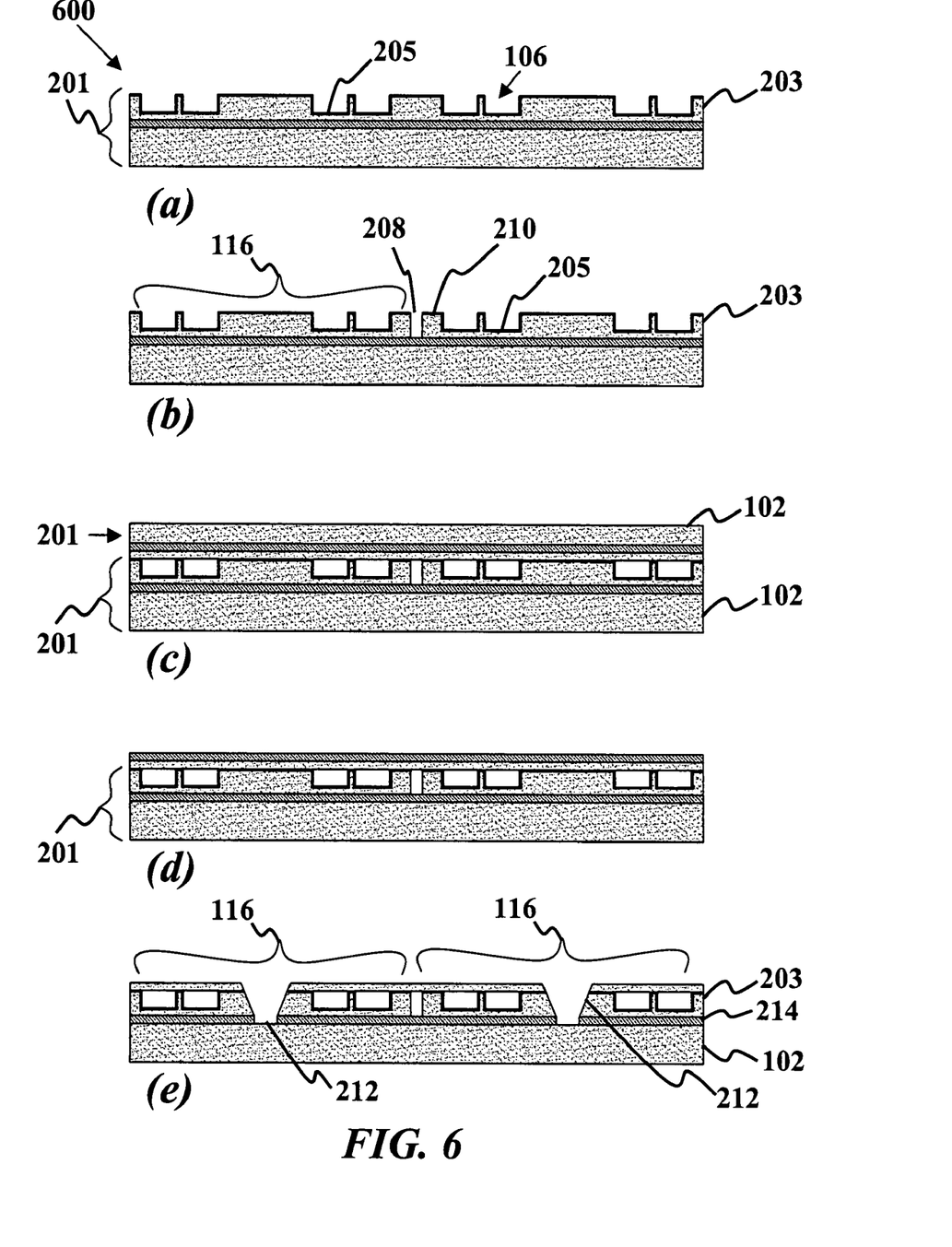
FIGS. 6a-6j show a process flow for a method of creating a trench isolated CMUT with supporting frame according to the present invention.

FIGS. 6a-6j show process flow for fabricating the device 600 described above. CMUT cell cavities 106 are first defined on the device layer 203 of the SOI wafer 201 using oxidation and buffered oxide etching (BOE) techniques, where the device layer 203 has a has an oxide insulation layer 205 disposed thereon to enable the cells 106 to operate in a collapsed-mode (not shown) without short-circuiting (FIG. 6a). The front electrical pads 210 are then electrically divided in a DRIE step, where the array elements 116 are separated from one another by etching separation trenches 208 on the device layer 203 (FIG. 6b). Next, another SOI wafer 201 with a membrane silicon layer 108 is fusion bonded to the device side 203 of the first SOI wafer 201 and annealed at 1000° C. for 30 minutes (FIG. 6c). The handle wafer 102 of the second SOI wafer 201 is removed in a heated tetramethylammonium hydroxide solution (FIG. 6d). A contact via 212 on each array element 116 is defined by photo lithography and wet etching of silicon in heated potassium hydroxide (KOH) solution using the BOX layer 212 of the second SOI wafer as the hard mask (FIG. 6e). This etching step stops automatically (not shown) at the BOX layer 214 underneath the device layer 203. Alternatively, a DRIE can be used for this etching step. A dry plasma etcher is used to remove the recessed BOX layer (not shown) in the via region. In this step, the exposed silicon 102 resulting from the KOH etching step serves as the hard mask. An aluminum layer is then sputtered on the membrane of the cells 106 to form the top electrode 110, as well as on the contact via 212 to establish electrical continuity for the signal electrodes 110 (FIG. 6f). The silicon substrate is thinned down to 200 µm by mechanical grinding and polishing (not shown). The front and back electrodes (see FIG. 6i) are separated from each other by providing electrode separation trenches 216 from removing conductive materials around the contact vias (FIG. 6g). A 7-µm-thick photo resist layer is spin-coated onto the back side of the SOI wafer and patterned (not shown). Through-wafer trenches 112 are etched on the bulk silicon wafer 102 for electrical isolation and to define the supporting frame 202 (FIG. 6h) as well as the signal electrodes. A layer of Ti/Cu/Au is evaporated onto the electrodes to enhance the electrical contact to the silicon (FIG. 6i). During evaporation, the wafer is tilted for 45° to prevent electrical shorting between neighboring elements (not shown). The CMUT arrays 200 are now ready to be flip-chip bonded 602 to the appropriate electronic circuits or printed circuit boards 604 (FIG. 6j).

The inventors fabricated trench-isolated, 2D, 16-element× 16-element, CMUT arrays with supporting frames 200 to demonstrate the feasibility of this technique. A summary of the device parameters is shown in Table I.

TABLE I

DEVICE PARAMETERS FOR TRENCH-ISOLATED CMUT ARRAY WITH A SUPPORTING FRAME.

| | |
|---|---|
| Membrane Width (µm) | 40 |
| Membrane Length (µm) | 140 |
| Number of Membranes/Element | 8 |
| Element Pitch (µm) | 250 |
| Membrane Thickness (µm) | 1.84 |
| Cavity Height (µm) | 0.15 |
| Substrate Thickness (µm) | 200 |
| Device Layer Thickness (µm) | 10 |
| BOX Layer Thickness (µm) | 1.95 |
| Trench Width (µm) | 50 |
| Frame Width (µm) | 30 |
| Silicon Wafer Resistivity (Ω-cm) | 0.025 |

Figure 7:
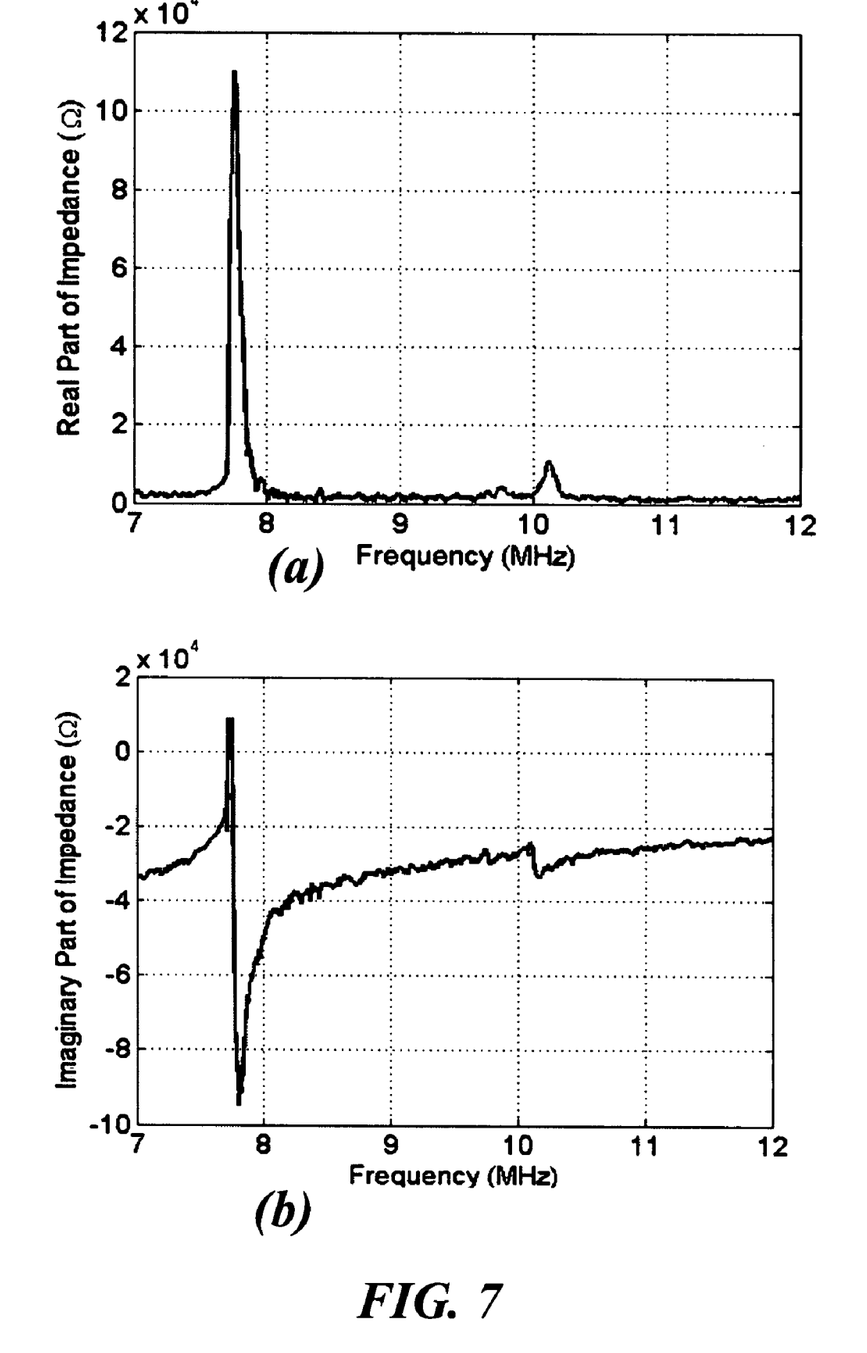
FIGS. 7a-7b show the typical real and imaginary parts of the input impedance according to the present invention.
Figure 8:
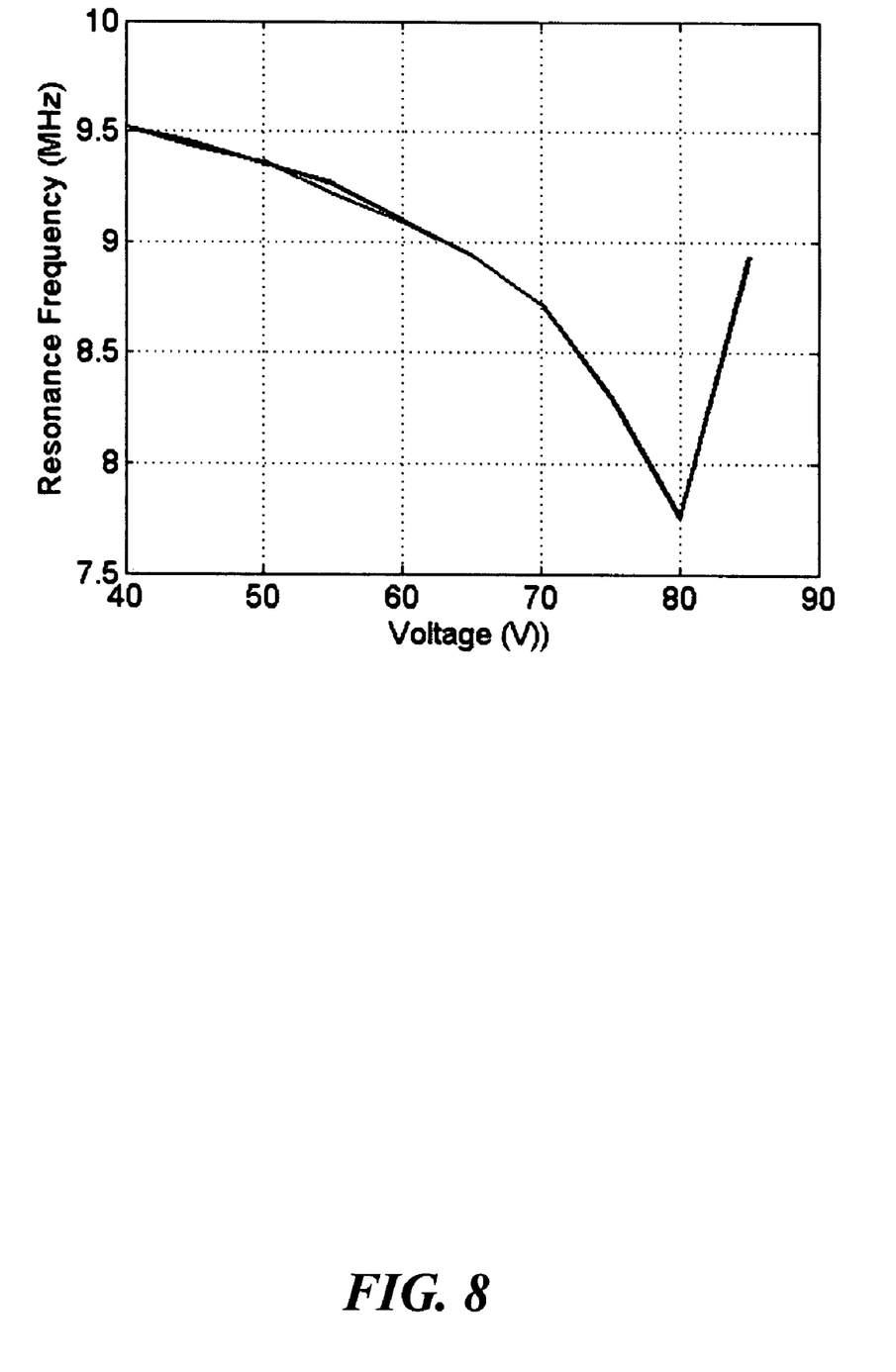
FIG. 8 Shows the resonant frequency as a function of DC bias voltage according to the present invention.

Electrical input impedance in air was measured by probing the signal electrodes on the finished devices using a network analyzer. FIGS. 7(a) and 7(b) show the typical real and imaginary parts of the input impedance. The resonant frequency as a function of DC bias voltage is shown in FIG. 8. The collapse voltage is found to be 80 volts, reasonably close to the predicted value of 82 volts. Across the array, the resonant frequency is uniform. The standard deviation is 0.02 MHz (0.23%). The inventors have successfully demonstrated devices with 16×16 elements in the array functioning.

The total device capacitance is measured to be 1.9 pF. Based on the design parameters, the predicted device capacitance is calculated to be 1.66 pF, and the parasitic capacitance is calculated to be 0.29 pF. Therefore, the total measured capacitance agrees with the theoretical prediction.

1D and 2D CMUT arrays with a supporting frame have been demonstrated. Through-wafer trench-isolated interconnects are implemented on theses arrays. The finished wafers can be handled like regular wafers. The fabrication process is compatible with both the surface micromachining and the wafer bonding processes developed for CMUTs because the trenches are fabricated after the formation of the CMUT membranes. The overall process is simple, and results in good device uniformity. These CMUT devices have a parasitic capacitance that is negligible when compared to the device capacitance. In air testing, the predicted resonant frequency and collapse voltage are reasonably close to the predicted values.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, one variation pertains to trench isolation patterns, where the patterns can be regular tessellations such as triangle, square and hexagonal. Other variations pertain to the trench isolation patterns, thickness, depth and geometry being arranged in any other configuration dictated by their application, bandwidth and power requirements.

All such variations are considered to be within the scope and spirit of the present invention as defined by the following claims and their legal equivalents.

What is claimed is:

1. A one-dimensional or two-dimensional capacitive micro-machined ultrasonic transducer (CMUT) array with supporting frame comprising:
 a silicon-on-insulator (SOI) wafer comprising a device layer, a buried oxide layer and a handle layer, wherein said device layer comprises a first structure disposed therein and said handle layer comprises a second structure disposed therein, wherein said first structure comprises at least three CMUT array elements having a conductive top layer disposed on a top side of said CMUT array elements and said second structure comprises at least two isolation trenches comprising an open span in said handle layer and at least one conductive electrode disposed on a bottom surface of said handle layer, and a region of said handle layer between said trenches forms a mechanical support frame, wherein at least one conductive via is disposed within said array elements and spans from a top surface of said device layer through said buried oxide layer to electrically connect said first structure to said second structure and is isolated from said conductive top layer, wherein said conductive electrode is disposed to conduct with said via.

2. The CMUT array with supporting frame of claim 1, wherein said conductive top layer comprises a conductive material selected from a group consisting of aluminum, titanium, tungsten and polysilicon.

3. The CMUT array with supporting frame of claim 1, wherein said conductive top layer comprises a highly conductive silicon membrane.

4. The CMUT array with supporting frame of claim 1, wherein said conductive via comprises a conductive material selected from a group consisting of aluminum, polysilicon and amorphous silicon.

5. The CMUT array with supporting frame of claim 1, wherein said conductive electrode is selected from a group consisting of copper, titanium, gold, platinum, aluminum and nickel.

* * * * *

UNITED STATES PATENT AND TRADEMARK OFFICE
CERTIFICATE OF CORRECTION

| | | |
|---|---|---|
| PATENT NO. | : 7,741,686 B2 | |
| APPLICATION NO. | : 11/880459 | |
| DATED | : June 22, 2010 | |
| INVENTOR(S) | : Butrus T. Khuri-Yakub et al. | |

It is certified that error appears in the above-identified patent and that said Letters Patent is hereby corrected as shown below:

IN THE SPECIFICATION

Please replace in the subject patent the paragraph starting in column 1, line 16

"The present invention was supported in part by grant number CA099059 from the NIH. The U.S. Government has certain rights in the invention."

with

"This invention was made with Government support under contract CA099059 awarded by the National Institutes of Health. The Government has certain rights in the invention."

Signed and Sealed this
Second Day of February, 2016

Michelle K. Lee
*Director of the United States Patent and Trademark Office*